United States Patent
Kumamoto et al.

[11] Patent Number: 6,129,993
[45] Date of Patent: Oct. 10, 2000

[54] HEAT SPREADER AND METHOD OF MAKING THE SAME

[75] Inventors: Shingo Kumamoto, Yasugi, Japan; Ichiro Kishigami, Harrison, N.Y.; Hironori Nakanishi; Hideya Yamada, both of Yasugi, Japan

[73] Assignee: Hitachi Metals, Ltd., Tokyo, Japan

[21] Appl. No.: 09/246,717

[22] Filed: Feb. 9, 1999

[30] Foreign Application Priority Data

Feb. 13, 1998 [JP] Japan .................................. 10-030770

[51] Int. Cl.$^7$ ............................ H01L 23/373; B32B 3/24
[52] U.S. Cl. ........................ 428/614; 428/635; 428/664; 428/676; 228/190; 257/720; 361/709
[58] Field of Search ...................................... 428/614, 620, 428/635, 676, 663, 664, 665; 228/190; 257/675, 677, 706, 707, 720, 712; 361/708, 709, 710

[56] References Cited

U.S. PATENT DOCUMENTS

| | | | |
|---|---|---|---|
| 3,295,935 | 1/1967 | Pflumm et al. | 428/635 |
| 3,368,122 | 2/1968 | Fishman et al. | 428/620 |
| 3,399,332 | 8/1968 | Savolainen | 428/614 |
| 4,025,997 | 5/1977 | Gernitis et al. | 428/621 |
| 4,283,464 | 8/1981 | Hascoe | 428/620 |
| 4,427,993 | 1/1984 | Fichot et al. | 428/614 |
| 4,482,912 | 11/1984 | Chiba et al. | 428/614 |
| 4,996,115 | 2/1991 | Eerkes et al. | 428/614 |
| 5,106,433 | 4/1992 | Nakamura et al. | 428/620 |
| 5,156,923 | 10/1992 | Jha et al. | 428/635 |
| 5,300,809 | 4/1994 | Nakamura et al. | 257/684 |
| 5,358,795 | 10/1994 | Nakamura et al. | 428/614 |

FOREIGN PATENT DOCUMENTS

| | | | |
|---|---|---|---|
| 385605 A2 | 9/1990 | European Pat. Off. | 357/81 |
| 60-239033 | 11/1985 | Japan . | |
| 2-231751 | 9/1990 | Japan | H01L 23/50 |
| 7-80272 | 8/1995 | Japan | B32B 15/01 |
| 8-232049 | 9/1996 | Japan | C22C 38/00 |
| 9-312361 | 12/1997 | Japan . | |

Primary Examiner—John J. Zimmerman
Attorney, Agent, or Firm—Sughrue, Mion, Zinn, Macpeak & Seas, PLLC

[57] ABSTRACT

Provided are a heat spreader that can reduce an increase in the thermal expansion coefficient up to high temperatures of not lower than 500° C. and has an excellent thermal expansion property and an adequate heat-conductive property and a method of making the same. This heat spreader comprises high-thermal-conductivity layers made of a Cu-base metal, low-thermal-expansion layers made of an Fe—Ni-base alloy each of which layers is provided with a plurality of through holes, and thermal expansion-restraining layers of a metal with a thermal expansion coefficient $\alpha$ at 30–800° C. of not more than $7.5 \times 10^{-6}/°$ C.

7 Claims, 5 Drawing Sheets

HEAT SPREADER AND METHOD OF MAKING THE SAME

BACKGROUND OF THE INVENTION

The present invention relates to a heat spreader that can diffuse heat, for example, even when the quantity of heat increases due to high integration design of semiconductor devices, a semiconductor device provided with the heat spreader, and a method of making the same.

In the CPU (central processing unit) of a computer, workstation, personal computer (PC), and etc., a ceramic package called a PGA (pin grid array) is mainly used, and heat generated from a silicon chip is diffused via a heat-release substrate (heat spreader) between the silicon chip and a heat sink fin made of Al. In recent LSIs, it becomes very important to dissipate the heat generated from silicon chips in view of the high speed design and large power consumption design thereof, and especially in LSIs for microcomputers and logic ASICs (application specific ICs), the diffusion of heat is accelerated by bringing a heat spreader into contact with a silicon chip.

Figure 8:
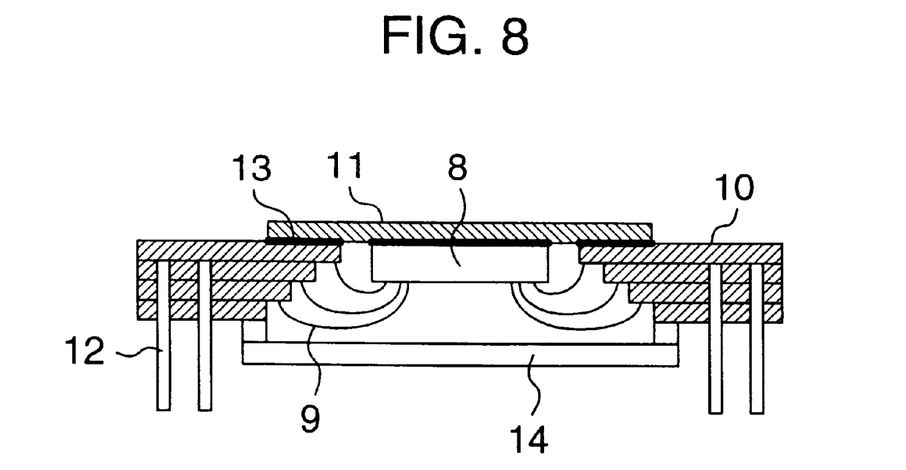
FIG. 8 shows an example of constitution of a PGA package to which the present invention is applied.

For example, a PGA (pin grid array) package shown in FIG. 8 comprises a heat spreader (11), a silicon chip (8), bonding wires (9), a ceramic substrate (10), pins (12), silver solder (13), and a lid (14). In this structure, the heat spreader (11) is in contact with the silicon chip (8) and, as a matter of course, it is important that the heat spreader (11) have good heat-diffusibility to release the heat generated from the silicon chip (8), and it is also of importance for the heat spreader (11) to have a thermal expansion coefficient similar to that of the silicon chip (8). Furthermore, because the heat spreader (11) is directly silver-brazed to the ceramic substrate (10), it is important that the heat spreader (11) be similar to the ceramic substrate (10) in the thermal expansion coefficient.

It is expected that demand for packages of this type will increase in the future. Also, it is necessary that heat spreaders for such applications, which are in contact with silicon chips, have thermal expansion matched to that of silicon chips and it is generally considered desirable that heat spreaders have 4 to $11 \times 10^{-6}/°$ C. or so as the average thermal expansion coefficient at 30–150° C.

Conventionally, 0.5 to 1 mm thick sheets of about 30 mm square made of a Cu—W-base alloy or Mo, which meet these requirements, have been used as the heat spreaders for semiconductor devices. However, these materials are expensive and besides the weight of packages of these materials is heavy because of high specific gravity, which is $17.0 \times 13^3$ $kg/m^3$ for 89W-11Cu and $10.2 \times 10^3$ $kg/m^3$ for Mo. This is a great disadvantage in terms of downsizing design and weight reduction design, which are the trends in recent LSIs.

In packages of LSIs of a type in which conventional lead frames are used unlike the above PGA type LSIs, the lead frame itself is formed of copper and a copper alloy which diffuse heat well. In this case, however, because the thermal expansion coefficient of the lead frame is larger than that of the silicon chip, internal stresses in the interface between the silicon chip and the lead frame cause such a fear as cracks are formed in the silicon chip due to the generation of stresses during a production process or in use. In order to solve this problem, the present inventors and others proposed, in JP-A-8-232049, an invention relating to a composite material for electronic parts in which a sinter layer of powder mainly composed of copper or a copper alloy is formed at least on one surface of an Fe—Ni-base alloy sheet of low thermal expansion and a method of making this composite material.

Further, the combinations of a low-thermal-expansion material provided with through holes and a high-thermal-conductivity material have been proposed in JP-A-2-231751, JP-A-7-80272, and etc.

In packages of PGA, etc. in which no lead frame is used, however, thermal conduction in the thickness direction (, i.e., in the lamination direction) is inferior in a case of a structure in which copper and an Fe—Ni-base alloy layers are merely laminated and, therefore, this structure cannot be used as a heat spreader. In view of the foregoing, a new heat spreader has become necessary in place of Cu—W and Mo sheets, which new heat spreader is inexpensive and, at the same time, small and thin, and which new heat spreader permits a weight reduction. Incidentally, in packages of a type in which no lead frame is used, the above PGA, BGA (ball grid array) and CSP (chip size package) have been put into practical use and future large demand is expected.

SUMMARY OF THE INVENTION

It is an object of the present invention to provide a heat spreader that can reduce an increase in the thermal expansion coefficient up to high temperatures of not lower than 500° C. and that has an excellent thermal expansion property and an adequate heat-conductive property, and a method of making the heat spreader.

The above conventional heat spreader was examined and it was found that an Fe—Ni-base alloy used has thermal expansion which abruptly increases when the temperature thereof exceeds the Curie point near 230° C. and that a low thermal expansion property cannot be obtained when the heat spreader is heated up to a heating temperature range of not lower than 500° C. at which silver brazing is performed.

Therefore, when the above conventional heat spreader is silver-brazed to a very thin ceramic of not more than 1 mm whose use in the future is expected, a difference in the amount of shrinkage between the heat spreader and the ceramic causes such a fear as the ceramic is broken or exfoliated in the cooling and solidifying steps after the heating for silver brazing. Thus, it becomes necessary to seek a low thermal expansion design at high temperatures.

Further, when materials of different kinds are joined (, that is, bonded) by cooling from a high-temperature condition as in joining by silver brazing, it is impossible to avoid the above problem, that is, when heat-release parts are joined with ceramics or metals called sealers such as Kovar, which are much used in semiconductor packages, it is necessary to match the thermal expansion properties thereof up to high temperatures of not lower than 500° C.

The present inventors made a detailed examination of heat spreaders subjected to high temperatures of not lower than 500° C. in order to solve the above problem. As a result, the inventors reached the present invention by finding that a low thermal expansion property can be realized from room temperature to a high-temperature region of not lower than 500° C. by alternately or continuously laminating both of Fe—Ni-base alloy sheets each provided with a plurality of through holes and Cu-base alloy sheets so that a multilayer structure is formed, and then by forming at least one thermal expansion-restraining layers on the outside of a laminate (, that is, multilayer structure) or between the layers of the laminate.

More specifically, according to the first aspect of the invention, there is provided a heat spreader that has at least one high-thermal-conductivity layer made of a Cu-base alloy, at least one low-thermal-expansion layer made of an Fe—Ni-base alloy provided with a plurality of through holes, and at least one thermal expansion-restraining layer made of a metal with a thermal expansion coefficient α at 30–800° C. of not more than 7.5×10$^{-6}$/° C., the high-thermal conductivity layer and the low-thermal conductivity layer being adjacent to each other, the through holes being filled with Cu-base alloy.

Further, in the heat spreader, it is preferable that the volume percentage of the thermal expansion-restraining layer is adjusted to 3–25%.

Furthermore, according to the second aspect of the present invention there is provided a heat spreader in which high-thermal-conductivity layers made of a Cu-base alloy and at least one low-thermal-expansion layer are alternately or continuously laminated, and at least one pair of the high-thermal-conductivity layers that sandwich the at least one low-thermal-expansion layer provide a continuum via through-holes made in the low-thermal-expansion layer, the at least one thermal expansion-restraining layer being located at the inner and/or outer side of the heat spreader.

Preferably, a metal layer made of at least one metal selected from Mo-base metals and W-base metals is formed as the thermal expansion-restraining layer of the heat spreader according to the present invention. More preferably, a Cu-base metal is laminated as the outermost layers in the present invention.

A desirable number of laminations in the present invention is 5 to 15 layers.

The above heat spreader can be obtained by a manufacturing method of the present invention, which comprises the steps of alternately or continuously stacking at least one Cu-base metal sheet and at least one Fe—Ni-base alloy sheet provided with a plurality of through holes, disposing at least one thermal expansion-restraining layer between the stacked layers and/or on at least one of the outside layers which thermal expansion-restraining layer is composed of a metal with a thermal expansion coefficient α at 30–800° C. of not more than 7.5×10$^{-6}$/° C., charging the stacked layers into a can, sealing the can after reducing the pressure in the can to below 10$^{-3}$ torr, then performing joining of the stacked layers by applying thereon pressure not less than 50 MPa in a temperature range of 700–1050° C. so that the through holes are filled with a Cu-base metal to thereby obtain a laminate, and then finishing the laminate to a predetermined thickness by rolling.

Further, it is preferable that a Cu-base metal is laminated as the outermost layers of the laminate in the present invention.

In the heat spreader of the present invention obtained by this method, the high-thermal-conductivity layers are joined together midway in the through holes made in the low thermal expansion layers, so that a continuous high-thermal-conductivity portion is formed via the through holes.

A Cu-base metal may be disposed on the top and bottom surfaces of the thermal expansion control layers as a preferable lamination structure of composite material.

DETAILED DESCRIPTION OF THE PREFERRED EMBODIMENTS

As mentioned above, an important feature of the present invention resides in the respect that at least one thermal expansion-restraining layer made of a metal with a thermal expansion coefficient α at 30–800° C. of not more than 7.5×10$^{-6}$/° C. is disposed on at least one of the outside layers and/or between the layers of the multilayer structure.

In order to realize the low thermal expansion property in a high temperature region of not lower than 500° C. according to the present invention, it is necessary to form the thermal expansion-restraining layer with a thermal expansion coefficient α at 30–800° C. of not more than 7.5×10$^{-6}$/° C. Concretely, this is the property provided by metals such as Mo-base, W-base, Nb-base and Ta-base metals. By disposing at least one layer of one of these metals on at least one of the outside layers and/or between the layers of the multilayer structure, it becomes possible to obtain the low thermal expansion property in a high temperature region of not lower than 500° C., which has been impossible in the case of composite materials of multilayer structure made of only an Fe—Ni-base alloy and a Cu-base metal. This can prevent the breakage, exfoliation, etc. of ceramics from occurring in a silver brazing step, for example.

Figure 9:
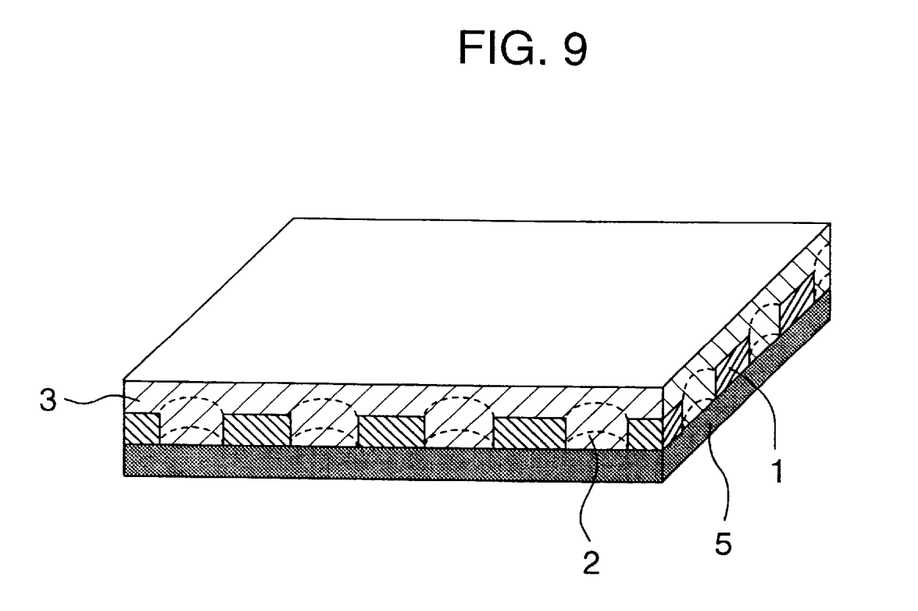
FIG. 9 is a perspective view of an example of a heat spreader having the simplest structure embodying the invention.

An example of the simplest structure of a heat spreader embodying the invention is shown in FIG. 9. The heat spreader in FIG. 9 is provided with a Fe—Ni base alloy layer (1) having a plurality of through holes therein, a Cu base alloy layer (3), and a Mo base alloy layer (5) functioning as a thermal expansion-restraining layer. Each of the through holes is filled with a Cu-base alloy.

The greatest purpose of using a Cu-base metal that constitutes the multilayer structure of the present invention is to ensure high thermal conductivity, and it is effective to use a Cu-base metal with thermal conductivity of not less than about 330 W/m·K in order to ensure the excellent heat-conductive property of the present invention.

Further, the greatest purpose of using an Fe—Ni-base alloy that constitutes the multilayer structure of the present invention is to ensure low thermal expansion property at a temperature region below the Curie point.

Through the use of the above multilayer structure comprising a Cu-base metal and an Fe—Ni-base alloy, it is possible to obtain the basic properties of a heat spreader that combine the excellent heat-conductive property and the excellent low thermal expansion property at a low temperature region below the Curie point.

Further, by making a composite material in which, for example, a Cu-base metal and an Fe—Ni-base alloy are combined with an Mo-base metal, it becomes possible to obtain a low thermal expansion property that is excellent up to a high temperature region while minimizing the use of expensive Mo-base metal elements in comparison with, for example, an Mo-base metal used singly or a composite material in which an Mo-base metal and a Cu-base metal are combined. This is favorable for reducing costs.

In addition, by making a composite material in which pure Cu with a specific gravity of, for example, about 8.95 g/cm$^3$ and an Fe—36Ni-base alloy with a specific gravity, for example, of about 8.15 g/cm$^3$ are combined with an Mo-base metal with a specific gravity of, for example, 10.2 g/cm$^3$, it becomes possible to obtain a low thermal expansion property that is excellent up to a high temperature region while minimizing the use of Mo-base metal elements with large specific gravity, thus enabling a weight reduction design of heat spreaders.

It is necessary that the thermal expansion control layers of the present invention have a thermal expansion coefficient $\alpha$ at 30–800° C. of not more than $7.5 \times 10^{-6}$/° C. in a high temperature region of not lower than 500° C. Concretely, it is preferable to use Mo-base metals and W-base metals that have an excellent heat-conductive property in comparison with Nb-base metals and Ta-base metals, so that a low thermal expansion property excellent at high temperatures and an especially excellent heat-conductive property can be realized because the thermal conductivities of the above Mo-base metals and W-base metals are high and not lower than 130 W/m·K.

Further, Mo-base metals are excellent in workability and especially effective when working is performed after joining as in the case of the manufacturing method of the present invention.

Further, in order to rapidly spread the heat from a part, from which heat is to be released, over the whole surface of a heat spreader, it is effective to form Cu-base alloy layers as the outermost layers of the heat spreader. In addition, the Cu-base alloy layers as the outermost layers of the heat spreader have also the effect of a buffer layer that relieves the thermal stresses caused between the ceramic and the heat spreader during silver brazing.

Figures 1A, 1B:
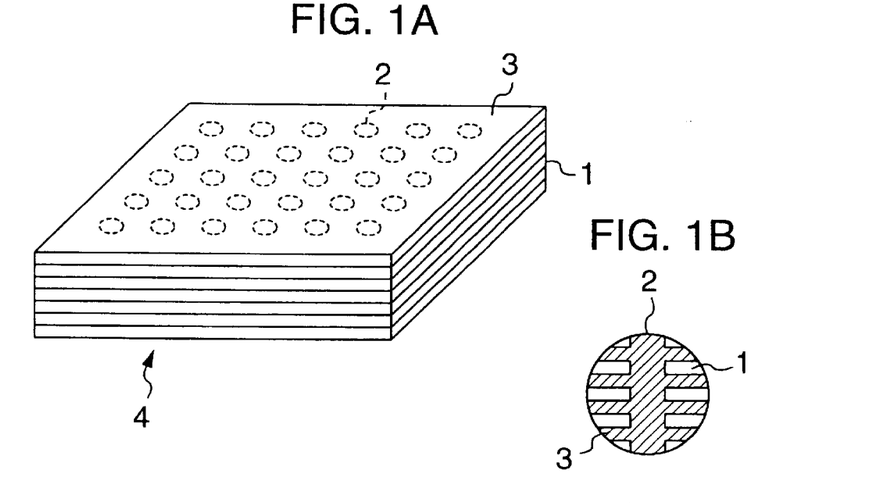
FIGS. 1A and 1B schematically show an example of basic constitution of a composite material of the present invention.

FIG. 1A shows the basic constitution (4) of a multilayer structure of the present invention in which high-thermal-conductivity layers made of a Cu-base metal and low-thermal-expansion layers made of an Fe—Ni-base alloy each provided with a plurality of through holes are laminated. As shown in FIG. 1B, the through holes (2) are filled with the high-thermal-conductivity layers (3) located on both sides of the low-thermal-expansion layers, providing a continuum via the through holes (2).

By providing this arrangement it becomes possible to ensure that heat transfer occurs across the low-thermal-expansion layers made of an Fe—Ni-base alloy in the thickness direction thereof.

Figure 2:
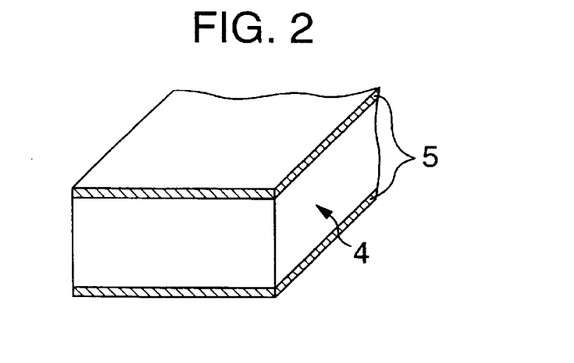
FIG. 2 shows an example in which the outermost layers of the composite material of the present invention are thermal expansion-restraining layers.

Further, in the present invention, layers made of at least one kind of metal selected from, for example, Mo-base metals and W-base metals are disposed as the thermal expansion-restraining layers made of a metal with a thermal expansion coefficient $\alpha$ at 30–800° C. of not more than $7.5 \times 10^{-6}$/° C. on the outside of the basic constitution (4) of multilayer structure as shown in FIG. 2.

In the basic constitution (4) of multilayer structure, the Fe—Ni-base alloy restrains the thermal expansion of the Cu-base metal in the direction of the plane of the laminated material. At temperatures exceeding the Curie point, however, the thermal expansion-restraining effect of the Fe—Ni-base alloy decreases because the thermal expansion coefficient increases abruptly at such high temperatures.

On the other hand, low thermal expansion at high temperatures can be realized in the present invention by providing at least one layer of at least one kind of metal selected from Mo-base metals and W-base metals that have isotropic thermal expansion coefficients, which metal has a small thermal expansion coefficient $\alpha$ at 30–800° C. even in a high temperature region of not lower than 500° C. compared with an Fe—Ni-base alloy (which thermal expansion coefficient is not more than $7.5 \times 10^{-6}$/° C).

In the present invention, in another case where a Cu-base metal layer is formed on the surface of the outermost layer of a heat spreader on which a part from which heat is to be released is mounted, it becomes possible to rapidly diffuse the heat form the part from which heat is to be released, such as a semiconductor chip, in the plane direction.

Figure 3:
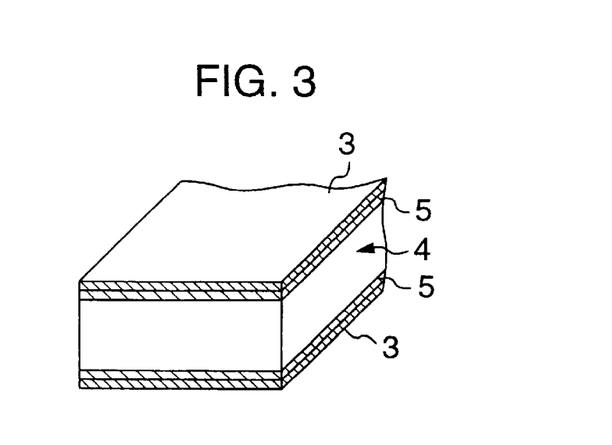
FIG. 3 shows an example in which the outermost layers of the composite material of the present invention are high-thermal-conductivity layers.

Specifically, as shown in FIG. 3, layers made of at least one kind of metal selected from, for example, Mo-base metals and W-base metals are disposed as the thermal expansion-restraining layers (5) made of a metal with a thermal expansion coefficient $\alpha$ at 30–800° C. of not more than $7.5 \times 10^{-6}$/° C. on the outside of the basic constitution (4) of multilayer structure, and high-thermal-conductivity layers (3) made of a Cu-base metal are further disposed on the outside of each of the thermal expansion-restraining layers (5).

Thus, the Cu-base metal layers (, i.e., high-thermal-conductivity layers) (3) disposed on the surface of a heat spreader are effective because they also function as buffer layers that relieve the thermal stresses caused during the silver brazing of the heat spreader to semiconductor chips, etc. which are parts from which heat is to be released or during the silver brazing thereof to package constituting materials made of ceramics, etc.

Further, as shown in FIG. 3, providing a Cu-base metal layer also on the side opposite to the above surface ensures the symmetry of the layers forming the heat spreader and is also effective in reducing the occurrence of warp.

Figure 5:
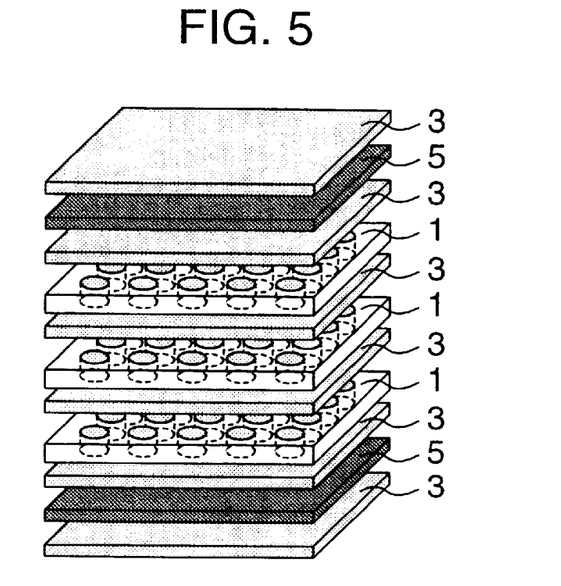
FIG. 5 shows an example in which the outermost layers of the composite material of the present invention are high-thermal-conductivity layers.
Figure 6:
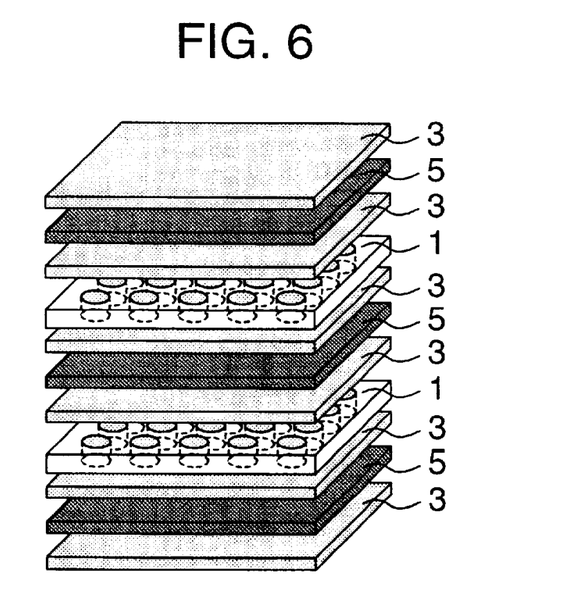
FIG. 6 shows an example in which thermal expansion-restraining layers are disposed between the layers of the composite material of the present invention.

In the present invention, it is also possible to dispose thermal expansion-restraining layers (5) between the inner layers of the basic constitution (4) of the multilayer structure, as shown in FIGS. 5 and 6. In this case, as shown in FIGS. 5 and 6, it is preferable that high-thermal-conductivity layers (3) be disposed as layers adjoining the thermal expansion-restraining layers (5) in order to ensure that the through holes (2) made in low-thermal-expansion layers (1) are positively filled with the high-thermal-conductivity layers (3).

In the present invention, at least one kind of metal selected from, for example, Mo-base metals and W-base metals is used as the thermal expansion-restraining layers made of a metal with a thermal expansion coefficient $\alpha$ at 30–800° C. of not more than $7.5 \times 10^{-6}$/° C.

The volume percentage of the thermal expansion-restraining layers in the heat spreader of the present invention is preferably not more than 35%. When the volume percentage of the thermal expansion-restraining layers is too high and when that of the Cu-base metal decreases, there occurs such a case where it is difficult to maintain the excellent heat-conductive property. The volume percentage of the thermal expansion-restraining layers that ensures thermal conductivities of not less than 150 W/m·K, which are practical for a heat spreader, is in the range of 3% to 25%.

In the present invention, the above heat spreader can be used in any form as semiconductor devices. In a typical example, the above PGA (pin grid array) package shown in FIG. 8 may comprise a heat spreader (11), a silicon chip (8), bonding wires (9), a ceramic substrate (10), pins (12) used as terminals silver solder (13), and a lid (14).

Joining is performed by applying pressures of not less than 50 MPa in the temperature range of 700 to 1050° C. in order to obtain bonding having reliability high enough to prevent exfoliation between the layers used in the present invention, i.e., Cu-base metal layers, Fe—Ni-base alloy layers and thermal expansion-restraining layers made of a metal with a thermal expansion coefficient α at 30–800° C. of not more than $7.5 \times 10^{-6}$/° C. when environmental changes such as plastic working (such as rolling), thermal shock, heat cycle, etc. occur.

When high pressures of not less than 50 MPa are applied in the temperature range of 700 to 1050° C., it is possible to form diffusion layers between Cu-base metal layers and Fe—Ni-base alloy layers very easily in comparison with conventional joining processes (which comprise the step of pressure-bonding by rolling and annealing), so that bonding with excellent reliability can be obtained.

Further, when high pressures of not less than 50 MPa are applied in the temperature range of 700 to 1050° C., it is possible to expose new-born surfaces on each layer between Cu-base metal layers and thermal expansion-restraining layers made of a metal with a thermal expansion coefficient α at 30–800° C. of not more than $7.5 \times 10^{-6}$/° C. or between Fe—Ni-base alloy layers and thermal expansion-restraining layers made of a metal with a thermal expansion coefficient α at 30–800° C. of not more than $7.5 \times 10^{-6}$/° C. These exposed, new-born surfaces permit joining (, i.e. bonding) which keeping an active condition and enable bonding with excellent reliability to be obtained in comparison with the pressure-bonding by cold rolling which is a conventional joining process.

The temperature at which the above joining is performed is preferably in the range of 700° C. to 1050° C.

In the present invention, when the temperature is lower than 700° C., the active condition between layers is inadequate, especially between thermal expansion-restraining layers and Cu-base metal layers or between thermal expansion-restraining layers and Fe—Ni-base alloy layers, and this is unpreferable because stable bonding cannot be obtained and because partial exfoliation and cracking occur.

Further, at high temperatures exceeding 1050° C., the mutual diffusion of Cu-base metal layers and Fe—Ni-base alloy layers proceeds excessively, impairing the high-thermal-conductivity property of Cu-base metal layers due to the Fe element and/or Ni element, etc. existing in a solid-solution state in Cu-base metal layers, which is unpreferable. This is also dangerous because there may occur such cases as Cu-base metal layers melt.

In the present invention, therefore, the temperature at which joining is performed is limited to the temperature range of 700° C. to 1050° C. Further, although the pressure is preferably high as much as possible, pressures of not higher than 200 MPa are practical in terms of the performance of devices and the pressure is preferably in the range of 80 to 150 MPa.

Further, in the present invention, steps are adopted which comprises, prior to the above joining, charging into a can Cu-base metal layers, Fe—Ni-base alloy layers and thermal expansion-restraining layers composed of a metal with a thermal expansion coefficient α at 30–800° C. of not more than $7.5 \times 10^{-6}$/° C., and then sealing the can after reducing the pressure in the can to below $10^{-3}$ torr.

In this invention, this process is employed to perform deaeration because if air remains in the through holes made in the Fe—Ni-base alloy material, the through holes cannot be adequately filled with a Cu-base metal and/or because the Cu-base metal charged from the two sides of through holes remains unjoined (unbonded) midway in the through holes, impairing thermal conduction.

Further, in this invention, the laminate is finished to a prescribed thickness by hot rolling or cold rolling after the above joining (bonding).

In the present invention, joining is performed under high pressures as mentioned above. However, there are cases where it is difficult to completely fill the through holes with a Cu-base metal with this processing only.

Therefore, in the present invention hot rolling or cold rolling is added after the above joining.

The heat spreader of the present invention obtained by this method provides a structure in which high-thermal-conductivity layers are joined together midway in the through holes formed in low-thermal-expansion layers. In other words, high-thermal-conductivity layers flow into the through holes made in low-thermal-expansion layers from both sides of the through holes owing to the application of high pressures and the high-thermal-conductivity layers join together midway in the through holes.

Incidentally, when cold rolling is added, the cleanliness and flatness suitable as composite materials for electronic parts can be easily obtained.

In the present invention, the low-thermal-expansion layers made of an Fe—Ni-base alloy are disposed with the primary objective of lowering the thermal expansion of the heat spreader of the present invention. They are preferably disposed in a manner that a thermal expansion coefficient α at 30–800° C. can be obtained in the range of 4 to $11 \times 10^{-6}$/° C. in order to ensure that heat spreader and semiconductor components have mutually close thermal expansion coefficients.

Specific Fe—Ni-base alloys that can be used are Fe-42%Ni alloys, Fe-36%Ni alloys, which are what we call invar alloys, Fe-31%Ni-5%Co alloys, which are what we call superinvar alloys, and alloys such as Fe-29%Ni-17%Co whose basic elements are 30–60% Ni and Fe as the remainder and in which a part of Ni is replaced by Co.

Furthermore, as a matter of course, other elements may be contained, that is, the elements of the 4A, 5A and 6A groups may be added to suit various requirements such as the thermal expansion property and mechanical properties so long as the austenitic structure is maintained.

For example, Cr effective in forming oxide films may be used in an amount of 8 wt. % or less, Nb, Ti, Zr, W, Mo and Cu may be used in 5 wt. % or less as elements for improving strength, Si and Mn may be used in 5 wt. % or less as elements for improving hot workability, and Ca, B and Mg may be added in 1 wt. % or less also as elements for improving hot workability.

In the present invention, a Cu-base metal is specified as the material for high-thermal-conductivity layers. Pure copper is excellent in thermal conductivity and effective as material for heat sinks or heat spreaders in which high thermal conductivity is important. In some cases, however, it is possible to add alloying elements in order to improve properties, such as mechanical properties, solderability, silver brazability and heat resistance depending on uses.

For example, Sn and Ni which are in a solid-solution state in copper or copper alloys can improve mechanical properties. Further, when Ti is added in combination with Ni, it precipitates as compounds of Ni and Ti in the matrix of copper, improving mechanical properties and heat resistance. Further, Zr improves the weatherability of solder. It is known that Al, Si, Mn and Mg improve the adhesiveness to resins.

Incidentally, the above elements, which degrade heat-diffusibility, should preferably be added to copper alloys in amounts of 10 wt. % or less because the copper or copper-alloy layers of the present invention are used to provide heat-diffusibility.

The Mo-base metals that may be used in the thermal expansion-restraining layers of the present invention may be pure Mo or any alloys mainly containing Mo, and the W-base metals may be pure W or alloys mainly containing W. Further, the Nb-base metals and Ta-base metals also may be pure metals of Nb and Ta or the alloys of Nb and Ta. As a matter of course, it is needless to say that these metals need to have a thermal expansion coefficient $\alpha$ at 30–800° C. of not more than $7.5 \times 10^{-6}/°$ C.

Working examples of the present invention are described below.

Figure 4A:
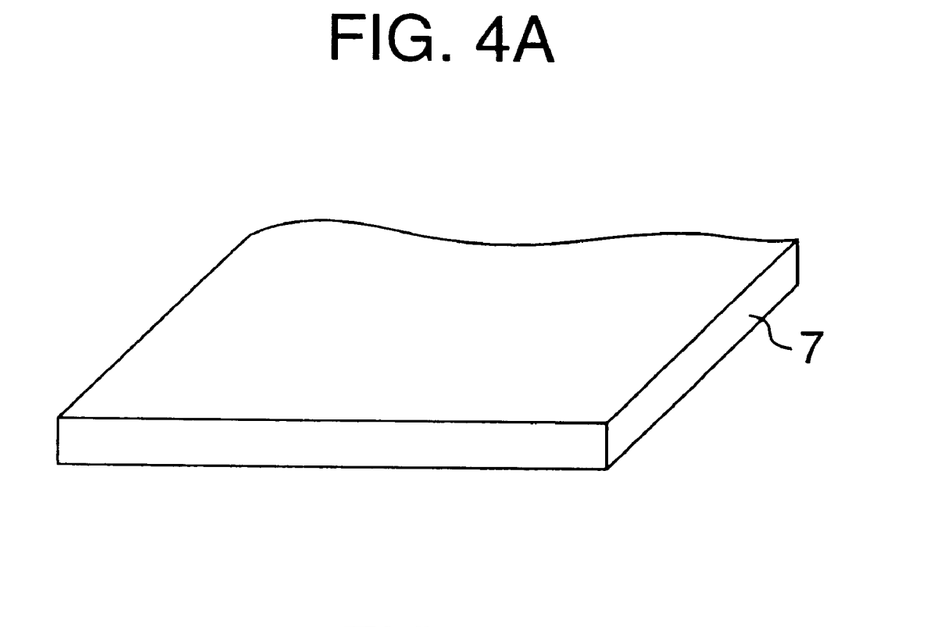
FIGS. 4A and 4B illustrate a starting material for the composite material of the present invention.
Figure 4B:
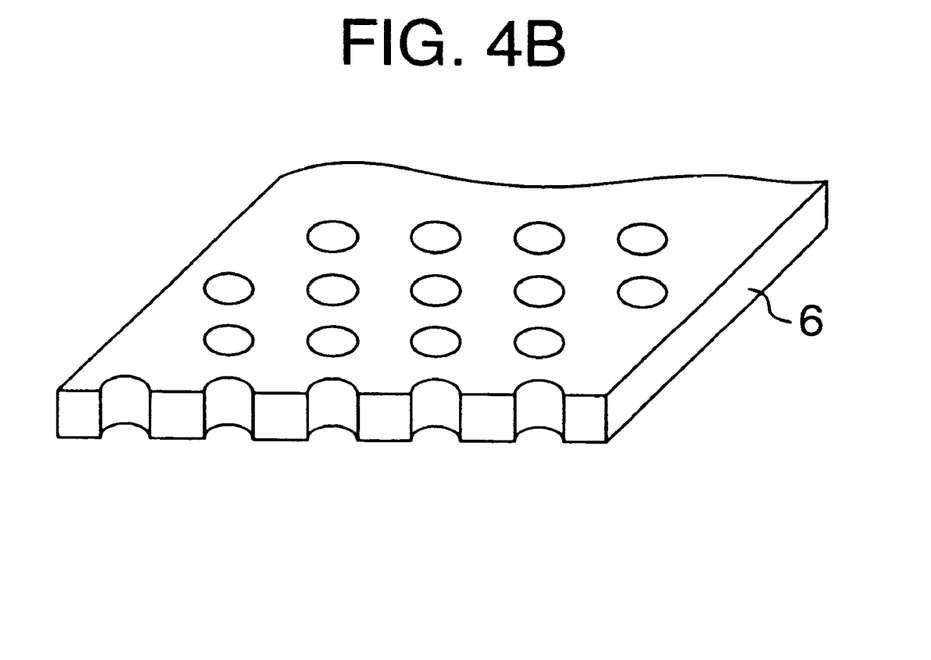

An Fe-36%Ni alloy was selected as the material for low-thermal-expansion layers and a 0.32 mm thick sheet of this Fe—Ni alloy was obtained by repeating cold rolling and annealing. Through holes 0.5 mm in diameter were made by photo-etching on the whole surface of the sheet of this Fe—Ni alloy at a pitch of 1,065 mm. The proportion of the through holes in the plane of the sheet is about 20% by area percentage. This sheet was slit to a width of 300 mm and then cut to a specified length of 500 mm, and resultant sheets were used as the material for low-thermal-expansion layers (6) shown in FIG. 4(*b*).

Pure copper (oxygen-free copper) was selected as a material of high thermal conductivity, and sheets of 0.25 mm and 0.35 in thickness were obtained. These sheets were slit to a width of 300 mm and then cut to s specified length of 500 mm, and they were used as the material for high-thermal-conductivity layers (7) shown in FIG. 4(*a*).

Further, pure Mo with a thermal expansion coefficient $\alpha$ at 30–800° C. of $5.85 \times 10^{-6}/°$ C. was selected as a material for thermal expansion-restraining, and sheets of 0.2 mm and 0.1 mm in thickness were obtained. These sheets were slit to a width of 300 mm and then cut to a specified length of 500 mm, and they were used as the material for thermal expansion-restraining layers.

Figure 7:
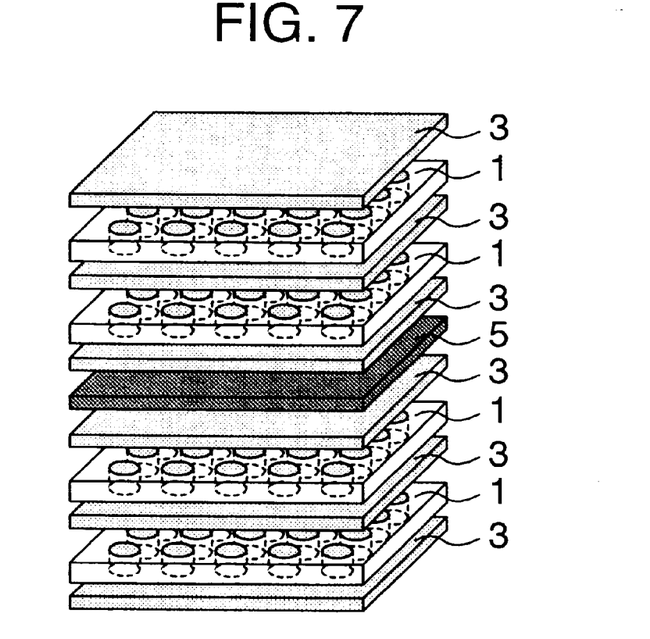
FIG. 7 shows an example in which one thermal expansion-restraining layer is disposed between the layers of the composite material of the present invention.

Then, these materials were laminated in the combinations shown in Table 1. The lamination structure shown in FIG. 5 is called the lamination structure A, that of FIG. 6 is called the lamination structure B, and that of FIG. 7 is called the lamination structure C.

In the lamination structure A, three low-thermal-expansion layers and four high-thermal-conductivity layers are alternately laminated in a manner that the high-thermal-conductivity layers made of pure copper sandwich the low-thermal-expansion layers made of an Fe—Ni-base alloy as the basic constitution of multilayer structure, thermal expansion-restraining layers are disposed on the two external surfaces of this basic constitution, and high-thermal-conductivity layers made of pure copper are further disposed on the outside of the thermal expansion-restraining layers.

Pure Cu sheets of 0.25 mm in thickness were used. Then, two kinds of laminations having two different Mo volume percentages of 15.0% and 8.1% in the whole heat spreader were formed by using pure Mo having two different thicknesses of 0.2 mm and 0.1 mm as the thermal expansion-restraining layers.

In the lamination structure B, the low-thermal-expansion layers made of an Fe—Ni alloy placed in the middle of the above multilayer structure in the lamination structure A were replaced with thermal expansion-restraining layers made of pure Mo so that three thermal expansion-restraining layers were included in the lamination structure B. Pure Cu sheets of 0.25 mm in thickness were used. Pure Mo sheets of 0.2 mm in thickness were used and the volume percentage of Mo was 23.0%.

The lamination structure C was formed to have such a basic constitution of multilayer structure as five low-thermal-expansion layers and six high-thermal-conductivity layers are alternately laminated so that the high-thermal-conductivity layers made of pure copper sandwich the low-thermal-expansion layers made of an Fe—Ni-base alloy and so that the low-thermal-expansion layer made of an Fe—Ni alloy and placed in the middle of the above multilayer structure is replaced with a thermal expansion-restraining layer. In other words, one thermal expansion-restraining layer is included in the lamination structure C. A thickness of 0.35 mm was used only for the pure Cu layers on the outermost surfaces and a thickness of 0.25 mm was used in other pure Cu layers.

Further, by using pure Mo layers having two different thicknesses of 0.2 mm and 0.1 mm, two kinds of laminations having two Mo volume percentages of 6.8% and 3.5% were prepared.

The lamination structure D that did not include a thermal expansion-restraining layer was also used in order to compare properties. In the lamination structure D, the replacement with a thermal expansion-restraining layer (which replacement was performed in the basic constitution of the multilayer structure of lamination structure C) was not performed, and five low-thermal-expansion layers and six high-thermal-conductivity layers were alternately laminated. Similarly to the lamination structure C, a thickness of 0.35 mm was used only for the pure Cu layers on the outermost surfaces and a thickness of 0.25 mm was used regarding other pure Cu layers. The volume percentage of Mo was 0%.

Regarding each of the above six kinds of laminates different from each other in the disposition and volume percentage of thermal expansion-restraining layers, ten pieces were prepared.

Further, JIS SUS304 sheets each having 0.5 mm thickness, 300 mm width and 500 mm length and having BN powder coated on the surfaces of the JIS SUS304 sheet were prepared. By using these JIS SUS304 sheets as the partitions of each of the laminates, it became possible to easily separate each laminate even after the above laminates stacked each other were simultaneously joined at high temperatures and high pressures.

Next, the laminates and BN-powder-coated JIS SUS304 sheets were placed and alternately stacked in a case made of JIS S15C with a wall thickness of 5 mm. This case was sealed by welding after deaeration to a reduced pressure below 10–3 torr.

By use of a hot hydrostatic press apparatus, this case made of JIS S15C (hereinafter referred to as the "can material") containing the laminates after deaeration was held under an increased pressure of 100 MPa for three hours at the various temperatures shown in Table 1 and the layers in the laminates were joined and integrated.

The material of JIS S15C on the top and bottom surfaces of the can material after hot hydrostatic pressing were removed by grinding, each of laminates was separated one by one because of the above BN-powder-coated sheets made of JIS SUS304 and were used as the materials before rolling. These materials before rolling were then processed by cold rolling and annealing, and 1 mm thick sheets were obtained.

Next, samples for measuring thermal conductivity and those for measuring thermal expansion were prepared from these sheets, and thermal conductivity and the thermal expansion coefficient in the transverse direction were measured.

Thermal conductivity at room temperature was measured by the laser flash method. The thermal expansion coefficient was measured in the temperature ranges of 150° C. (α at 30–150° C.), 300° C. (α at 30–300° C.), and 800° C. (α at 30–800° C.) while using 30° C. as the standard.

The results of the measurement of these properties are shown in Table 1.

by means of a press. By use of a eutectic silver solder (melting point of about 780° C.) brazing, the joining (bonding) of the alumina ceramic and the heat spreader were performed through the steps of heating up to 830° C. and then cooling. In a heating spreader having no thermal expansion-restraining layer, cracks occurred in the ceramic and the amount of warpage deformation on the surface of the heat spreader of 30 mm×30 mm reached 250 μm. In the case of the heat spreader of the present invention that has thermal expansion-restraining layers containing 15.0 vol. % Mo, no crack occurred in the ceramic and the amount of warpage deformation on the surface of heat spreader was 30 μm. Thus, joining with excellent flatness could be realized.

When pure Mo is used as thermal control layers as in the present working example, α at 30–800° C.=10.0×10$^{-6}$/° C. can be obtained when the volume percentage of expansion-restraining layers is 8.1%, that is, a value close to α at

TABLE 1

| No. | Thermal expansion-restraining layer Type | vol % | Lamination structure | HIP temperature (° C.) | Thermal conductivity (W/m · K.) | Thermal expansion coefficient (×10$^{-6}$/° C.) 30–150° C. | 30–300° C. | 30–800° C. | Remarks |
|---|---|---|---|---|---|---|---|---|---|
| 1 | Pure Mo | 23.0 | B | 900 | 230 | 7.0 | 6.9 | 6.5 | Present invention |
| 2 | " | 15.0 | A | 1000 | 154 | 8.2 | 8.6 | 7.8 | Present invention |
| 3 | " | " | " | 950 | 166 | 8.1 | 8.3 | 7.9 | Present invention |
| 4 | " | " | " | 900 | 188 | 7.6 | 8.0 | 7.9 | Present invention |
| 5 | " | " | " | 850 | 211 | 7.5 | 7.8 | 8.1 | Present invention |
| 6 | " | 8.1 | " | 1000 | 152 | 8.6 | 10.2 | 10.5 | Present invention |
| 7 | " | " | " | 950 | 170 | 8.4 | 9.6 | 10.2 | Present invention |
| 8 | " | " | " | 900 | 193 | 8.1 | 9.2 | 10.0 | Present invention |
| 9 | " | " | " | 850 | 202 | 7.5 | 8.8 | 9.5 | Present invention |
| 10 | " | 6.8 | C | 900 | 185 | 7.6 | 9.0 | 11.1 | Present invention |
| 11 | Pure Mo | 3.5 | C | 900 | 182 | 7.9 | 9.5 | 13.1 | Present invention |
| 12 | None | 0 | D | 900 | 157 | 7.0 | 8.3 | 14.8 | Comparative example |
| | Al$_2$O$_3$ Ceramic | | | | 14 | 5.6 | 6.5 | 7.6 | — |
| | Kovar (Fe-29Ni-17Co alloy) | | | | 17 | 5.6 | 4.8 | 10.2 | — |

As shown in Table 1, by adjusting the amount rate of the thermal expansion-restraining layers it becomes possible to ensure that the heat spreader of the present invention can provide a low thermal expansion property of 6.5 to 10.5× 10$^{-6}$/° C. or so even at a high temperature of 800° C. while providing a high heat-conductive property of not less than 150 W/m·K.

Especially, in a case where pure Mo is used as the thermal expansion-restraining layer as in this working example, α at 30–800° C.=7.9×10$^{-6}$/° C. can be obtained when the volume percentage of expansion-restraining layers is 15.0%, the value of which α is close to α at 30–800° C. of alumina ceramics shown as a reference value in Table 1. Therefore, when an alumina ceramic which is thin and which has low strength is silver-brazed to the heat spreader of the present invention, joining with good flatness is possible without the occurrence of cracks in the ceramics.

A 1.5 mm thick alumina ceramic and a 1.0 mm thick heat spreader of the present invention were jointed together by silver brazing. The heat spreader was fabricated by blanking 30–800° C. of Kovar (an Fe-29%Ni-17%Co alloy) shown in Table 1 can be obtained in this working example. Therefore, in a case where a Kovar material is silver-brazed to the heat spreader of the present invention too the sake of semiconductor packages in which high accuracy is required, packages with small amounts of warpage deformation and excellent flatness can be obtained.

A frame made of Kovar with a wall thickness of 1.0 mm and a size of 12.7 mm wide×30.5 mm long×4.5 mm high and a 1.3 mm thick heat spreader of the present invention were actually joined together by silver brazing. The heat spreader was fabricated by blanking by means of a press. By use of a eutectic silver solder (melting point of about 780° C.) for brazing, the joining of frame made of Kovar and heat spreader were performed through the stops of heating up to 830° C. and then cooling. After the joining by silver-soldering, the amount of warpage deformation of heat spreader surface in the longitudinal direction was measured on the inner side of the frame made of Kovar. In a heating spreader having no thermal expansion-restraining layer, the amount of warpage deformation reached 65 μm. In the case of the heat spreader of the present invention that has thermal expansion-restraining layers containing 8.1 vol. % Mo, the amount of warpage deformation was not larger than 10 μm. Thus, joining with excellent flatness could be realized.

According to the present invention, it is possible to obtain materials that provide a small thermal expansion coefficient at high temperatures, small thermal expansion in the heat occurrence range of usual semiconductors, and a good heat-conductive property.

Further, because the composite materials of the present invention are joined by applying high pressures at high temperatures in comparison with the conventional cold pressing-diffusion annealing method, they provide remarkably improved reliability in adhesion and substantially improve the reliability of parts.

What is claimed is:

1. A heat spreader comprising at least one high-thermal-conductivity layer made of Cu-base metal, at least one low-thermal-expansion layer made of Fe—Ni-base alloy which layer is provided with a plurality of through holes, and at least one thermal expansion-restraining layer made of a metal with a thermal expansion coefficient α at 30–800° C. of not more than $7.5 \times 10^{-6}$/° C., the high-thermal-conductivity layer and the low-thermal-conductivity layer being adjacent to each other, the through holes being filled with Cu-base alloy.

2. A heat spreader according to claim 1, the volume percentage of said thermal expansion-restraining layer being adjusted to 3–25%.

3. A heat spreader according to claim 1, comprising high-thermal-conductivity layers of Cu-base alloy and at least one low-thermal-expansion layer of Fe—Ni base alloy both of which layers are alternately or continuously laminated, at least one pairs of said high-thermal-conductivity layers that sandwich said at least one low-thermal-expansion layer being made to form a continuum via through-holes formed in the low-thermal-expansion layer, and said at least one thermal expansion-restraining layer being located at inner and/or outer side of said heat spreader.

4. A heat spreader according to claim 1, wherein said thermal expansion-restraining layer is made of at least one metal selected from the group consisting of Mo-base metals and W-base metals.

5. A heat spreader according to claim 1, wherein the outermost layers of said heat spreader are Cu-base metal layers.

6. A method of making heat spreader sheet, comprising the steps of alternately or continuously stacking at least one Cu-base metal sheet, and at least one Fe—Ni-base alloy sheet provided with a plurality of through holes, disposing at least one thermal expansion-restraining layer between the stacked layers and/or on at least one of the outermost layers which thermal expansion-restraining layer is made of a metal with a thermal expansion coefficient α at 30–800° C. of not more than $7.5 \times 10^{-6}$/° C., charging the stacked layers into a can, sealing the can after reducing pressure of the can below $10^{-3}$ torr, then performing joining of the stacked layers by applying thereon pressure not less than 50 MPa in a temperature range of 700–1050° C. so that said through holes is filled with a Cu-base metal to thereby obtain a laminate, and then finishing the laminate to a predetermined thickness by rolling.

7. A method of making heat spreader sheet according to claim 6, further, comprising the step of disposing the Cu-base metal as outermost layers of said sheet.

* * * * *